(12) United States Patent
Kishi et al.

(10) Patent No.: US 8,286,447 B2
(45) Date of Patent: Oct. 16, 2012

(54) METHOD FOR PRODUCING QUARTZ GLASS CRUCIBLE

(75) Inventors: Hiroshi Kishi, Akita (JP); Minoru Kanda, Akita (JP)

(73) Assignee: Japan Super Quartz Corporation, Akita-Shi (JP)

( * ) Notice: Subject to any disclaimer, the term of this patent is extended or adjusted under 35 U.S.C. 154(b) by 532 days.

(21) Appl. No.: 12/169,838

(22) Filed: Jul. 9, 2008

(65) Prior Publication Data
US 2010/0005836 A1    Jan. 14, 2010

(51) Int. Cl.
  *C03B 19/01* (2006.01)
  *C03B 19/06* (2006.01)
(52) U.S. Cl. ............. 65/17.3; 65/17.4; 65/17.5; 65/17.6
(58) Field of Classification Search ............ 65/144, 65/302, 17.3–17.6; 264/633
See application file for complete search history.

(56) References Cited

U.S. PATENT DOCUMENTS

| | | | |
|---|---|---|---|
| 4,416,680 A * | 11/1983 | Bruning et al. ............ | 65/144 |
| 2003/0024467 A1 * | 2/2003 | Phillips et al. ............ | 117/20 |
| 2005/0120945 A1 | 6/2005 | Hansen | |

FOREIGN PATENT DOCUMENTS

| | | |
|---|---|---|
| JP | 06-191986 | 7/1994 |
| JP | 10-025184 | 1/1998 |
| JP | 2007-513587 | 5/2007 |
| WO | 2005/056886 | 6/2005 |

OTHER PUBLICATIONS

JP06-191986 Machine Translation as provided by AIPN Japan Patent Office at http://dossier1.ipdl.inpit.go.jp/AIPN/odse_top_dn.ipdl?N0000=7400 on Oct. 5, 2010.*
English Language abstract of JP 06-191986.
English Language abstract of JP 2000-169287.
U.S. Appl. No. 12/168,375, filed Jul. 7, 2008, and entitled "Method for Producing Vitreous Silica Crucible".
KR Office action, dated Jun. 20, 2011 along with an english translation thereof.

* cited by examiner

*Primary Examiner* — Matthew Daniels
*Assistant Examiner* — Jodi C Franklin
(74) *Attorney, Agent, or Firm* — Greenblum & Bernstein, P.L.C.

(57) ABSTRACT

A method of producing a quartz glass crucible by arc melting a quartz powder molded product loaded on the inner side of a mold while performing vacuum suction, includes initiating the melting of quartz powder from the rim edge of a quartz powder molded product, subsequently lowering the arc electrode or raising the mold to heat and melt the sections on the downside of the rim edge. The method is preferably carried out such that the inner surface of the crucible is sealed within a time corresponding to 10% of the total arc time starting from the initiation of arc melting, and the seal thickness is 3 mm or less. The quartz glass crucible thus produced is useful for the pulling up of silicon single crystals and has a uniform glass layer with fewer internal bubbles.

5 Claims, 2 Drawing Sheets

METHOD FOR PRODUCING QUARTZ GLASS CRUCIBLE

BACKGROUND OF THE INVENTION

1. Field of the Invention

The present invention relates to a method for producing a quartz glass crucible used for the pulling up of silicon single crystals, the quartz glass crucible having a uniform glass layer with fewer internal bubbles.

2. Description of Related Art

Single crystal silicon is mainly produced by a CZ method. This method is a method for producing single crystal silicon by dipping a seed crystal into a molten silicon liquid at a high temperature contained in a quartz crucible, and then slowly pulling up the seed crystal. The method utilizes a quartz glass crucible of high purity for storing the molten silicon liquid.

The quartz glass crucibles used for the pulling up of single crystal silicon are mainly produced according to an arc melting method. This method includes producing a quartz glass crucible by depositing quartz powder, to a certain thickness, on the inner surface of a rotating mold made of carbon to thus form a quartz powder molded product, and heating and melting the quartz powder by means of arc discharge of an electrode installed on the inner upper side of the mold to vitrify the quartz powder (rotating mold method).

In connection to the above-described method, there is known a method of melting the quartz powder by deaerating the quartz powder molded product under reduced pressure through suction from the mold side, in order to eliminate bubbles inside the glass layer (Patent Document 1 and Patent Document 2). In this melting process, deaerating the quartz powder molded product under reduced pressure (this is referred to as vacuum suction) necessitates increasing the degree of vacuum inside the quartz powder molded product, by sealing the inner surface of the quartz powder molded product by melting the inner side uniformly to form a thin glass layer on the surface.

With regard to the above production method for producing a glass crucible by melting a quartz powder molded product, in conventional production methods in which ark melting is initiated at the center of the mold, the entire inner side of the crucible is simultaneously heated, and thus quartz powder can be melted uniformly; however, since the rim edge on the upper part of the quartz powder molded product has a heat retaining property that is lower than that of the bight section or bottom section of the molded product, the melting rate at the rim edge is slow, and a thin glass layer is not satisfactorily formed on the surface of the rim edge. Thus, the degree of vacuum inside the quartz powder molded product is not elevated, and a crucible having fewer internal bubbles in the glass layer cannot be obtained. On the other hand, if the rim edge is melted under an increased calorific value of arc melting so as to supplement insufficient melting of the rim edge, there is a problem in that the bight section or the bottom section is excessively heated and melts, causing the shape of the quartz powder molded product to become susceptible to disintegration.

[Patent Document 1] Japanese Unexamined Patent Application No. 06-191986

[Patent Document 2] Japanese Unexamined Patent Application No. 10-025184

The invention has been made to address the above-described problems in conventional production methods, and according to an aspect of the invention, there is provided a method of producing a quartz glass crucible having a uniform glass layer with fewer internal bubbles.

SUMMARY OF THE INVENTION

The production method of the invention is a method for production of a quartz glass crucible solving the conventional problems in the art by adopting the following constitutions.

Specifically, the invention has the following exemplary embodiments.

(1) A method for producing a quartz glass crucible, the method comprising arc melting a quartz powder molded product loaded on the inner side of a mold while performing vacuum suction, wherein melting of quartz powder is initiated from the rim edge of the quartz powder molded product, and then either lowering the arc electrode or raising the mold to heat the parts on the downside of the rim edge to melt.

The quartz glass crucible includes a cylindrically shaped straight trunk section, a curved region which is on the lower side of the straight trunk section, and a bottom section having a almost horizontal surface, which is on the lower side of the curved region.

(2) The method for producing a quartz glass crucible according to (1) above, wherein melting of quartz powder is initiated from the rim edge of the quartz powder molded product, and then heating is performed in order of the crucible wall section, the bight section and the bottom section, to seal the inner side of the crucible.

The crucible wall section refers to the vertical surface of the cylindrically shaped straight trunk section, and the crucible bight section refers to the curved region with a relative small radius of curvature, which lies between the cylindrically shaped straight trunk section and the bottom section with a large radius of curvature.

(3) The method for producing a quartz glass crucible according to (1) or (2) above, wherein the inner surface of the crucible (from the rim edge to the sidewall section, bight section and bottom section) is sealed within a time period corresponding to 10% or less of the total arc time starting from the initiation of arc melting.

The initiation of arc melting refers to the time point at which the inner side of the quartz powder molded product starts to melt under the action of arc discharge, and the total arc time refers to the time period from the initiation of arc melting to the stoppage of arc discharge.

(4) The method for producing a quartz glass crucible according to any one of claim 1 to claim 3, wherein the thickness of quartz glass layer (seal thickness) which is melted and sealed inner surface of the crucible is 3 mm or less.

According to the production method of the invention, during the production of a crucible carried out by arc melting a quartz powder molded product loaded on the inner side of a mold while performing vacuum suction, since melting of quartz powder is initiated from the rim edge of the quartz powder molded product, the rim edge is sufficiently heated, and an inner side sealing is certainly formed at the rim edge. Furthermore, since the arc electrode is lowered or the mold is raised after melting the rim edge, in order to heat and melt the crucible from the side wall section to the bight section and the bottom section, the crucible is not heated excessively, and an inner side seal of a thin glass layer is uniformly formed over the entire inner side of the quartz powder molded product. Therefore, the vacuum of the inside of the quartz powder molded product during vacuum suction can be increased, and thus a quartz glass crucible having fewer internal bubbles can be produced.

The "seal" implies that when a quartz powder molded product loaded on the inner side of a mold is subjected to vacuum suction of about −50 kPa, the inner surface of a crucible is sealed by molten quartz glass to the extent that a bubble content of 1.0% or less can be realized in a thickness of 1 mm to 3 mm from the crucible surface. In conventional methods for producing quartz glass crucibles, when a quartz powder molded product loaded on the inner side of a mold is subjected to vacuum suction to about −30 kPa, the bubble content in a thickness ranging from 2 mm to 6 mm was only about 2.0%.

According to the production method of the invention, it is preferable to perform sealing by melting the entire inner surface of the crucible within a time period corresponding to 10% or less of the total arc time starting from the initiation of arc melting, and it is also preferable that the seal thickness (thickness of molten layer) formed by heating and melting the inner surface of the crucible is 3 mm or less. Thereby, the entirety of the crucible including from the side wall part including a rim edge to the bight part and the bottom part, is uniformly and appropriately heated and melted, and thus a sealing of a thin glass layer can be uniformly formed over the entire inner surface of the crucible.

REFERENCE NUMERALS

2: Electrode, 4: Drive mechanism
15: Rim edge, 16: Sidewall part, 17: Bight part, 18: Bottom part
20: Arc discharge device

DETAILED DESCRIPTION OF THE INVENTION

Hereinafter, the invention will be described in more detail with reference to exemplary embodiments.

The production method of the invention is a method for producing a quartz glass crucible, the method comprising arc melting a quartz powder molded product loaded on the inner side of a mold while performing vacuum suction, wherein melting of quartz powder is initiated from the rim edge of the quartz powder molded product, and after the quartz powder at the rim edge has melted, either the arc electrode is lowered or the mold is raised, to heat the parts on the downside of the rim edge to melt.

Figure 1:
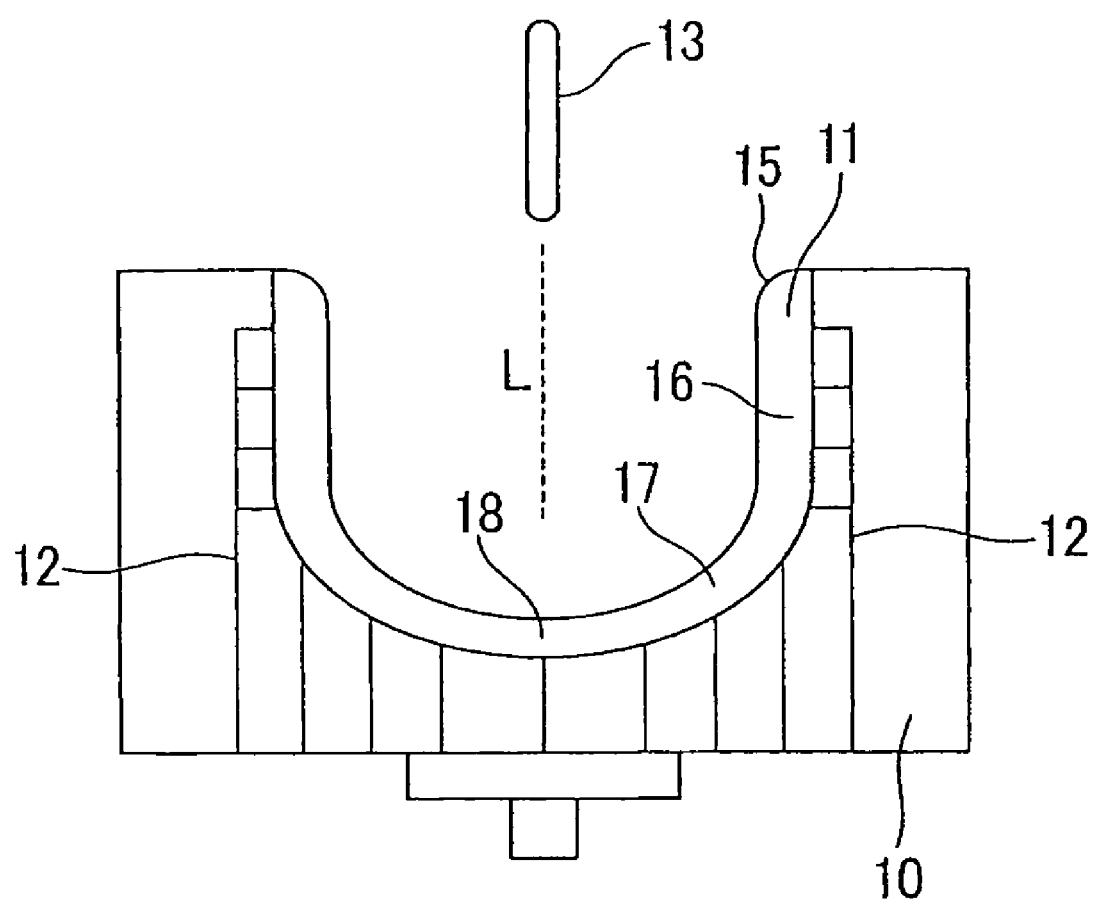
FIG. 1 is a conceptual diagram depicting the production of a quartz glass crucible according to the rotating mold method.

An outline of the apparatus for production of a quartz crucible based on heating and melting of a quartz powder molded product on the inner surface of a rotating mold, is shown in FIG. 1.

As depicted in the drawing, quartz powder is loaded over nearly the entire surface of the inner side of the rotating mold 10, which is cylindrically shaped with a bottom, to a predetermined thickness. The mold 10 is preferably formed from, for example, carbon or the like.

In the inside of the mold 10, a plurality of vent holes 12 for vacuum suction are provided such that the vent holes are connected to a vacuum pump which is not depicted, and these vent holes 12 are open to the inner side of the mold. An electrode 13 for arc heating is provided along the center line L of the mold 10. Furthermore, a means for moving the mold 10 or electrode 13 vertically and horizontally (not depicted) is provided, so that the electrode 13 can be disposed at any position within a certain range from the center line L of the mold 10. The electrode 13 shown in the drawing is only one in number, but two or three or more electrodes may also be used, and it would be preferable if arc discharge could occur from the lower ends of the electrodes. The electrode 13 is preferably formed from carbon or the like.

In the method for crucible production of the present exemplary embodiment, arc discharge is generated at the lower end part of the electrode 13, while subjecting the quartz powder molded product 11 in the mold 10 to vacuum suction through the vent holes 12 by operating the vacuum pump, which is not depicted, and the quartz powder molded product 11 in a state where the quartz powder has been deposited is heated to melt.

At this time, when the quartz powder molded product 12 in the mold 10 is heated and melted by vacuum suction, the electrode 13 is set on the upper side of the rim edge 15 along the center line L of the mold 10 at the time of the initiation of heating, and heating and melting of quartz powder is initiated from the rim edge 15.

After heating the rim edge 15 for a predetermined time to melt, either the mold 10 is raised or the electrode 13 is lowered or the both parts are simultaneously approached, to start heating and melting the parts on the lower side of the rim edge 15 of the quartz powder molded product 11. It is preferable that the heating of the downside parts is started sequentially from the rim edge 15 to the side wall part 16, a bight part 17 and bottom part 18 of the crucible in this order to melt the crucible. In this manner, a seal layer of molten quartz powder is formed over the entire surface of the inner side of the quartz powder molded product 11. The method for relative displacement of the electrode 13 and the mold 10 may be carried out through a slow approach at a constant speed, or through stepwise displacement through three or more stages.

Here, the side wall part 16 of the crucible is the vertical wall part of the quartz powder molded product 11, the bight part 17 is the part extending from the side wall part 16 down to the bottom part 18, and the bottom part 18 is the part extending almost horizontally from the bight part 17 and laterally stretching. The rim edge 15 is the upper end surface of the side wall part 16.

When an air-tight seal layer is formed over the entire surface of the inner side of the quartz powder molded product 11, ventilation from the inner peripheral side to the outer peripheral side of the quartz powder molded product 11 is obstructed, and thereby the inside of the quartz powder molded product 11 is suddenly depressurized by the exhaustion through the vent holes 12. Then, the seal layer collapses toward the inner side of the mold 10, and the quartz powder interposed between the seal layer and the inner side of the mold 10 is pressed, so that adjacent quartz powder grains bind with each other. When the quartz powder molded product 11 is heated by sustaining this state, the quartz powder grains firmly bind with each other to form a crucible. Through the above-described process, a quartz glass crucible having a bilayer structure with a transparent layer having virtually no pores on the inner side, and an outer porous layer containing numerous pores on the outer side, is produced.

In the production method of the present exemplary embodiment, it is preferable that apportionment of the heating time is limited to a time corresponding to 10% or less of the total arc time starting from the initiation of arc melting, and that the quartz powder molded product 11 is heated to melt from the rim edge 15 to the side wall section 16, a bight section 17 and a bottom section 18 in this order, to thus seal the entire inner surface. In this case, during the time period of the remaining 90% of the total arc time, vacuum suction can be effectively performed over the entire area of the quartz powder molded product 11, and the quartz powder grains are made to bind with each other by allowing the molten seal layer to, for example press quartz powder to the inner side of the mold 10. Thus, a quartz glass crucible having a small level of porosity can be formed.

In addition, the arc temperature and the total arc time are determined depending on the size of the crucible. Specifically, for example, for a quartz crucible having an external diameter of 30 inches, the melting temperature of the crucible is in general 1600 to 2500° C., and the total arc time is 60 minutes. In this case, it is preferable that the arc melting is initiated from the rim edge 15, and within 6 minutes from the initiation of arc melting, the quartz powder is heated and melted from the side wall section 16 to the bight section 17 and the bottom section 18 of the quartz powder molded product 11 in this order, to thus seal the entire area of the inner surface of the quartz powder molded product 11.

With regard to the production method, it is preferable that the thickness of the quartz glass layer which melts, until the inner surface of the quartz powder molded product 11 is sealed (hereinafter, referred to as seal thickness) is 3 mm or less. A quartz glass layer melted before the entire area of the inner surface of crucible is sealed contains many bubbles. To eliminate these bubbles, there is required a treatment of heating the quartz glass to a high temperature, and degassing the gas in the bubbles within the seal region in post-processes, so as to annihilate the bubbles or reduce the size thereof. Since the range which can be effectively subjected to this treatment is a range from the surface to about 3 mm in depth, increasing the seal thickness to 3 mm or higher is not an advantageous strategy. The preferred seal thickness is from 1.0 to 2.0 mm, and is more preferably from 0.05 to 0.5 mm.

After sealing the entire inner surface of the crucible by heating and melting the quartz powder molded product from the rim edge to the side wall section, the bight section and the bottom section within a time corresponding to 10% or less, more preferably 0.001 to 5.0%, of the total arc melting time starting from the initiation of arc melting, subsequently arc melting is performed for the remaining arc melting time, while performing vacuum suction, and thereby the quartz powder molded product is vitrified by heating and melting. In addition, vacuum suction may be performed simultaneously with the initiation of arc melting, or may also be initiated at any time after the initiation of arc melting, for example, after the sealing of the inner surface of the crucible.

Figure 2:
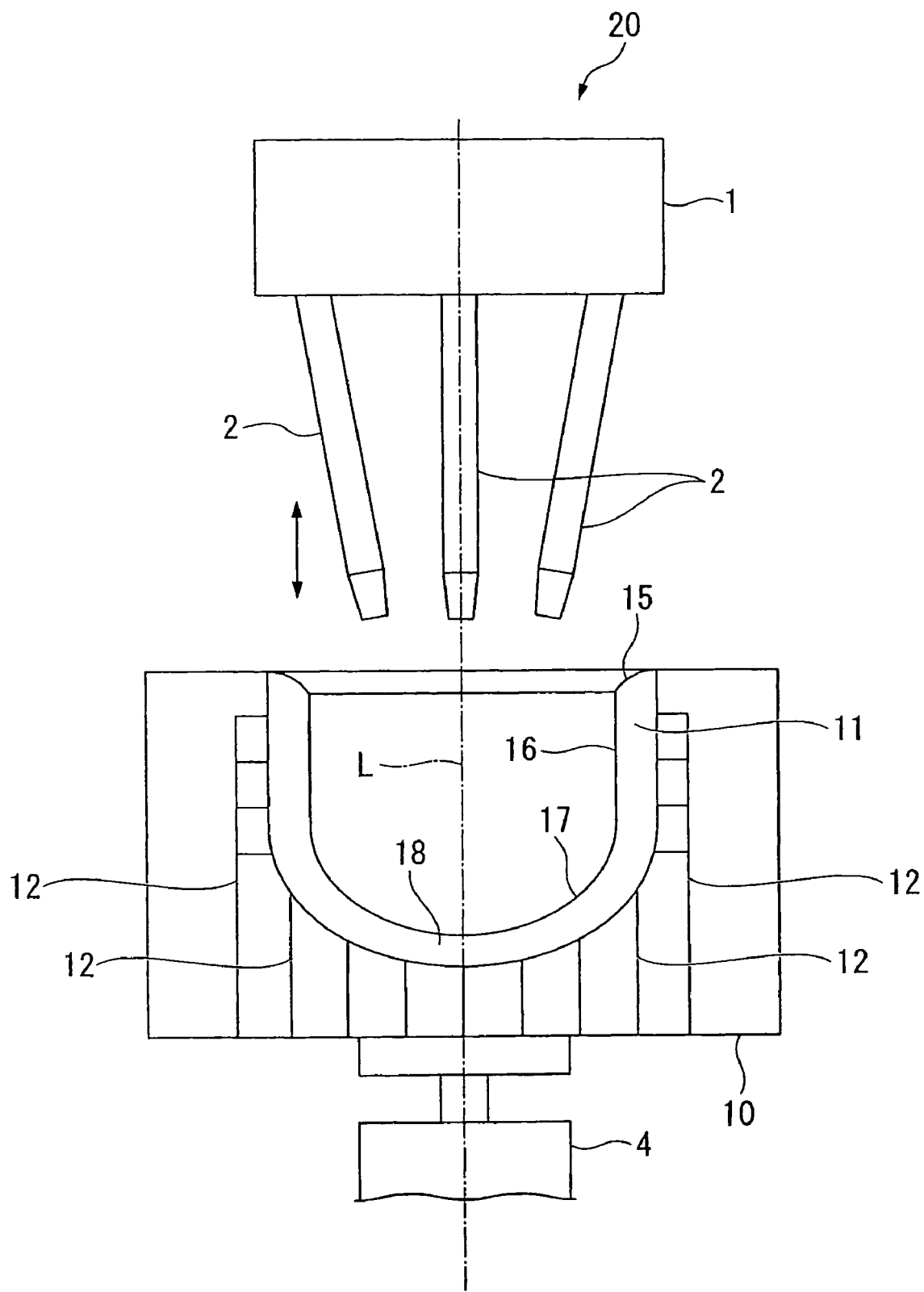
FIG. 2 is a vertical cross-sectional view illustrating another example of the apparatus for production of quartz glass crucibles, which can be used in the invention.

FIG. 2 illustrates a more specific exemplary embodiment of the apparatus for crucible production.

This apparatus mainly consists of a mold 10 which is cylindrically shaped with a bottom, a drive mechanism 4 for rotating the mold 10 by axial rotation, and an arc discharge apparatus 20 for heating the inside of the mold 10. The mold 10 is, for example, formed from carbon, and in the inside thereof, a plurality of vent holes 12 are formed open to the inner side of the mold. A depressurization mechanism, which is not depicted, is connected to the vent holes 12, so that the mold 10 can be rotated and at the same time, can be subjected to air suction from the inner side through the vent holes 12. In the inner side of the mold 10, a quartz powder molded product 11 can be formed by depositing quartz powder thereon. This quartz powder molded product 11 is maintained on the inner wall surface by the centrifugal force generated by the rotation of the mold 10. When depressurization is performed through the vent holes 12 while the maintained quartz powder molded product 11 is heated with an arc discharge apparatus 20, the quartz powder molded product 11 melts to form a quartz glass layer. After cooling, the quartz glass crucible is removed from the mold 10 and shaped to produce a quartz glass crucible.

The arc discharge apparatus 20 includes a plurality of carbon electrodes 2 in the shape of a rod formed from high purity carbon, an electrode drive mechanism 1 for maintaining and displacing these carbon electrodes 2, and a power supply unit (not depicted) for applying an electric current to each carbon electrode 2. There are three carbon electrodes 2 in this example, but it is acceptable if arc discharge can be generated between the carbon electrodes 2, and the number of the carbon electrodes may be two, or even four or more. The shape of the carbon electrode 2 is also not limited. The carbon electrodes 2 are disposed such that they approach each other closer at the tip end. The power supply may be direct current or alternating current, but in this exemplary embodiment, each phase of three phase alternating current is connected to each of the three carbon electrodes 2.

Even in the case of producing a quartz glass crucible using this apparatus, the same treatment as in the apparatus of FIG. 1 may be carried out. That is, at the time of initiating the heating, the electrode 13 is provided on the upper side of the rim edge 15 according to the center line L of the mold 10, and melting of the quartz powder is initiated from the rim edge 15.

After melting the rim edge 15 by heating for a predetermined time, the carbon electrodes 2 approach the mold 10, and heating and melting of the sections on the lower side of the rim edge 15 of the quartz powder molded product 11 is started sequentially. That is, melting is started from the rim edge 15, and subsequently to the sidewall section 16, the bight section 17 and the bottom section 18 of the crucible in this order.

The other processes and conditions may be the same as those in the case of using the apparatus of FIG. 1.

The bore diameter of the quartz glass crucible that can be produced in the invention is not particularly limited, but is preferably 26 inches or more and 50 inches or less, and more preferably 26 inches or more and 44 inches or less.

According to the invention, a quartz glass crucible in which the inner surface layer of the crucible is formed of synthetic glass synthetic quartz glass, and the outer surface layer of at least the wall section of the crucible is formed of vitrified natural quartz, can also be produced. In this case, natural quartz powder and synthetic quartz powder may be laminated in two layers on the inner side of the mold 10, and then the above-described melting treatment may be performed.

Additionally, the natural quartz is a raw material obtained by excavating quartz ore that is present in nature, and subjecting the ore to processes such as grinding and purification, and the natural quartz powder is formed from crystals of α-quartz. The natural quartz powder contains 1 ppm or more of aluminum (Al) and titanium (Ti). In addition to those, the natural quartz powder has higher levels of metal impurities than synthetic quartz powder does. The natural quartz powder contains virtually no silanol. The amount of silonal of glass obtained by melting the natural quartz powder is less than 100 ppm.

The synthetic quartz is a raw material produced by chemical synthesis, and the synthetic quartz glass powder is amorphous. Since the raw material of the synthetic quartz is gaseous or liquid, it is possible to purify the raw material easily, and the synthetic quartz powder can be made to have a higher level of purity than the natural quartz powder. As the raw material for the synthetic quartz glass, there may be mentioned those derived from gaseous raw materials such as carbon tetrachloride, and those derived from liquid raw materials such as silicon alkoxide. It is possible with the synthetic quartz powder glass to have any kind of impurities at a level of 0.1 ppm or less.

In the production method of the invention, the seal thickness is preferably 3 mm or less, irrespective of the bore diameter of the crucible.

In the production method of the invention, it is preferable that, at the time point of initiating melting of the rim edge of the quartz powder molded product, the lower end of the electrode is preferably disposed at a position higher than the rim edge (upper end) of the quartz powder molded product by 0 to 20 to 150% of the bore diameter of the quartz glass crucible to be produced, as the distance along the axial direction of the mold. This difference in height is more preferably 30 to 100%, and even more preferably 40 to 70%.

Moreover, at the time point of completing the formation of a seal layer over the entire surface of the inner side of the quartz powder molded product, the lower end of the electrode is preferably disposed at a position lower than the rim edge (upper end) of the quartz powder molded product by 30 to 40% of the bore diameter of the quartz glass crucible to be produced. This difference in height is more preferably 20 to 30%, and even more preferably 10 to 20%.

The difference in height of the three members at the time point of initiating melting of the rim edge, and the difference in height of the three members at the time point of completing the formation of a seal layer, may be of any combination.

The amount of relative displacement of the electrode and the mold along the axial direction from the time point of initiating melting of the rim edge to the time point of completing the formation of a seal layer, is preferably 0 to 100%, more preferably 0 to 50%, and even more preferably 0 to 30%, of the bore diameter of the quartz glass crucible to be produced.

In the case of satisfying such ranges, a seal layer is likely to be uniformly formed as a thin glass layer over the entire surface of the inner side of the quartz powder molded product, without the inside of the quartz powder molded product being excessively heated. Therefore, the degree of vacuum of the quartz powder molded product can be further increased, and a quartz glass crucible having fewer internal bubbles can be produced.

The seal thickness at the bottom section of the quartz powder molded product is more preferably 0.05 mm or more and 3 mm or less, and even more preferably 1.0 to 2.0 mm.

The time period from the time point of initiating melting the rim edge to the time point of completing the formation of a seal layer, is preferably 0.01% or more and 10% or less, and more preferably 0.01 to 5.0%, of the total arc time, which is from the time point of initiating melting the rim edge to the completion of arc discharge. Within such a range, the quartz powder grains of the quartz powder molded product can be firmly bound with each other, while performing vacuum suction sufficiently and effectively, and thus a quartz glass crucible having smaller porosity can be easily produced.

The production method of the invention may have a heating process for degassing the gas of air bubbles in the quartz glass layer to eliminate or diminish the air bubbles. Specifically, the quartz glass crucible obtained after the arc melting process may be heated in a furnace at 1600 to 2500° C., and more preferably 1800 to 2200° C., for 0.2 to 2.0 hours, and more preferably 0.6 to 1.0 hours.

As shown above, the preferred exemplary embodiments of the invention have been described, but the invention is not intended to be limited to these exemplary embodiments. Within the scope of not departing from the purport of the invention, it is possible to apply addition, omission, substitution and other modifications to the constitution. The invention is not to be limited by the above-described explanation, and is defined only by the scope of the appended claims.

EXAMPLES

Hereinafter, the invention will be described with reference to Examples as well as Comparative Examples.

In the case where a quartz crucible having an external diameter of 30 inches was produced by heating and melting a quartz powder molded product while performing vacuum suction according to the rotating mold method, heating and melting was performed under the conditions indicated in Table 1 within a total arc time of 50 minutes, and the internal bubbles in the produced quartz glass crucible were measured. This measurement of bubble content may be performed using, for example, a method of detecting bubbles present in the vicinity of the inner surface, by irradiating a quartz crucible, which is the object being tested, with light supplied from a light source, imaging and observing the irradiated quartz crucible with an image capturing optical system such as an optic camera, and performing image processing such as binarization, general quadrilateral calculation or silhouette extraction, on the basis of the imaging information, may be used (see JP-A No. 11-228283). These results are presented in Table 1, together with the heating conditions.

As shown in Table 1, all of the crucibles of Example 1 to Example 3 produced by the method of the invention have conspicuously fewer internal bubbles. On the other hand, the crucibles of Comparative Examples 1 to 6 produced under conditions deviating from the production conditions of the invention, all have markedly large amounts of internal bubbles in the bight section and bottom section of the crucibles, or have markedly large amounts of internal bubbles in the bight section.

TABLE 1

|  | Order of melting | Seal melting time | Seal thickness | Bubble content in side wall section | Bubble content in bight section | Bubble content in bottom section |
|---|---|---|---|---|---|---|
| Example 1 | Rim edge → wall → bight.bottom | 8 | 2 | 0.02 | 0.03 | 0.04 |
| Example 2 | Rim edge → wall → bight.bottom | 6 | 1 | 0.01 | 0.03 | 0.03 |
| Example 3 | Rim edge → wall → bight.bottom | 10 | 3 | 0.03 | 0.03 | 0.02 |
| Comparative Example 1 | Rim edge → wall → bight.bottom | 14 | 1 | 1.10 | 1.20 | 1.10 |
| Comparative Example 2 | Rim edge → wall → bight.bottom | 8 | 7 | 1.00 | 1.50 | 0.05 |
| Comparative Example 2 | Rim edge → bight.bottom → wall | 8 | 2 | 0.50 | 1.40 | 1.20 |
| Comparative Example 3 | Wall → bight.bottom → rim edge | 93 | 2 | 1.80 | 2.20 | 0.50 |

TABLE 1-continued

|  | Order of melting | Seal melting time | Seal thickness | Bubble content in side wall section | Bubble content in bight section | Bubble content in bottom section |
|---|---|---|---|---|---|---|
| Comparative Example 4 | Wall → rim edge → bight.bottom | 37 | 2 | 1.10 | 1.30 | 0.10 |
| Comparative Example 5 | bight.bottom → wall → rim edge | 93 | 2 | 1.80 | 2.10 | 0.80 |
| Comparative Example 6 | bight.bottom → rim edge → wall | 69 | 2 | 1.60 | 1.60 | 0.70 |

(Remarks)
The seal melting time is the percentage of proportion of the seal melting time with respect to the total arc time from the initiation of an arc to the completion thereof; the seal thickness is the thickness of quartz glass layer (mm) that has melted until the inner surface of a crucible is sealed; and the unit of bubble content is percentage.

While preferred embodiments of the invention have been described and illustrated above, it should be understood that these are exemplary embodiment, of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for producing a quartz glass crucible, the method comprising melting a quartz powder molded product loaded on the inner side of a mold, through arc discharge from an arc electrode, while performing vacuum suction, wherein the melting of quartz powder is initiated from a rim edge of the quartz powder molded product, and after the quartz powder at the rim edge is melted, heating is performed from a wall section of the quartz powder molded product to a bight section and a bottom section of the quartz powder molded product in order, to thereby seal the entire surface of the inner side of the quartz powder molded product,
wherein:
at the time point of initiating melting of the rim edge of the quartz powder molded product, the lower end of the electrode is disposed at a position higher than the rim edge of the quartz powder molded product by 20 to 150% of a bore diameter of the quartz glass crucible to be produced, as the distance along the axial direction of the mold;
the time period from the time point of initiating melting the rim edge to the time point of sealing of the entire surface of the inner side of the quartz powder molded product, is 0.01% or more and 10% or less of a total arc time, the total arc time being a time from the time point of initiating melting the rim edge to the time point of completing arc discharge, and
the molten thickness of the quartz powder molded product from the time point of initiating melting the rim edge to the time point of sealing of the entire surface of the inner side of the quartz powder molded product, is 0.05 mm or more and 3 mm or less.

2. The method for producing a quartz glass crucible according to claim 1, wherein sealing the entire surface of the inner side of the quartz powder molded product, the lower end of the electrode is disposed at a position lower than the rim edge of the quartz powder molded product by 30 to 40% of the bore diameter of the quartz glass crucible to be produced, as the distance along the axial direction of the mold.

3. The method for producing a quartz glass crucible according to claim 1, wherein the amount of relative displacement of the electrode and the mold along the axial direction from the time point of initiating melting of the rim edge to the time point of completing the formation of a seal layer, is 0 to 100% of the bore diameter of the quartz glass crucible to be produced.

4. The method for producing a quartz glass crucible according to claim 1, further comprising, after producing the quartz glass crucible, a heating process for degassing the gas in air bubbles of the quartz glass layer.

5. The method for producing a quartz glass crucible according to claim 4, wherein the heating process involves heating the quartz glass crucible obtained after the arc melting process, in a furnace at 1600 to 2500° C. for 0.2 to 2.0 hours.

* * * * *